United States Patent [19]
Taki et al.

[11] Patent Number: 5,902,119
[45] Date of Patent: May 11, 1999

[54] LEADFRAME TIP ARRANGEMENT DESIGNING METHOD

[75] Inventors: Hirokazu Taki; Akihiro Goto; Yoshiharu Takahashi; Yasuhito Suzuki, all of Tokyo; Takao Takahashi, Hyogo; Takashi Arita, Hyogo; Satoshi Ookyuu, Hyogo, all of Japan

[73] Assignee: Mitsubishi Denki Kabushiki Kaisha, Tokyo, Japan

[21] Appl. No.: 08/885,352

[22] Filed: Jun. 30, 1997

[30] Foreign Application Priority Data

Mar. 12, 1997 [JP] Japan .................................... 9-057436

[51] Int. Cl.$^6$ .................................................. H01L 21/44
[52] U.S. Cl. .......................................... 438/111; 438/123
[58] Field of Search .................................... 438/111, 121, 438/123, 125

[56] References Cited

U.S. PATENT DOCUMENTS

| | | |
|---|---|---|
| 4,653,174 | 3/1987 | Gilder, Jr. et al. ........................ 438/15 |
| 5,245,214 | 9/1993 | Simpson . |
| 5,300,815 | 4/1994 | Rostoker ................................. 438/612 |
| 5,313,095 | 5/1994 | Tagawa et al. . |
| 5,438,021 | 8/1995 | Tagawa et al. . |
| 5,451,812 | 9/1995 | Gomi . |
| 5,635,424 | 6/1997 | Rostoker ................................. 438/106 |

FOREIGN PATENT DOCUMENTS 7-49894  2/1995  Japan .

*Primary Examiner*—Kevin M. Picardat
*Attorney, Agent, or Firm*—Burns, Doane, Swecker & Mathis, LLP

[57] ABSTRACT

A designing method calculates leadframe tip arrangement. The method comprises the steps of setting a leadframe tip arrangement region opposed to a die pad sideline of a leadframe, setting a leadframe tip arrangement line in the leadframe arrangement region, and arranging a predetermined number of leadframe tips on the leadframe tip arrangement line at proper intervals. The method allows for the independent calculation of various parameters.

8 Claims, 4 Drawing Sheets

LEADFRAME TIP ARRANGEMENT DESIGNING METHOD

The following application is based on Japanese Patent Application No. Hei 9-057436, filed on Mar. 12, 1997, which is incorporated herein by reference.

BACKGROUND OF THE INVENTION

1. Field of the Invention

The present invention relates to a method for designing the arrangement of tips of a leadframe used in a semiconductor device or the like and, more specifically, to a leadframe tip arrangement designing method which determines an optimum arrangement of leads of a leadframe.

2. Background Art

In conventional leadframe tip arrangement designing methods, as exemplified by Japanese Patent Application Laid-Open No. 7-49894, the arrangement position of a cavity line, for instance, of leadframe tips is specified and the leadframe tip width and interval are determined according to the same criterion (such as criterion pertaining to a circle diameter). Therefore, it is difficult to provide proper arrangement positions. For the same reason, it is difficult to provide optimum values independently for those parameters.

FIG. 8 shows an algorithm of a conventional leadframe tip arrangement designing method of the above-described kind. In FIG. 8, step S1-2 denotes a design condition input step for inputting design conditions such as leadframe tip arrangement lines. Step S4-2 denotes a leadframe tip width setting step for setting a leadframe tip width. Step S4-3 denotes a leadframe tip interval calculation step for determining a leadframe tip interval. Step S5-2 denotes a processing step for judging whether the leadframe tip width and interval fall within the ranges of the desired design conditions. Step S7 denotes a processing step for judging whether the leadframe tips satisfy design criteria. Finally, step S8 denotes a processing step for illustrating the design results to the user.

Referring to FIG. 8, the conventional leadframe tip position determining method will be described below in further detail. First, at step S1-2, design conditions of leadframe tip arrangement lines such as a cavity line are inputted. At step S4-2, a leadframe tip width is set by defining a leadframe width in accordance with the diameter of a circle. At step S4-3, a leadframe position (i.e. where to dispose the leadframe) is determined by determining the center coordinates of the circle. The leadframe interval is also determined. At step S5-2, it is judged whether the tip width and interval of the leadframe (that are defined by a tangential line of the circle determined at steps S4-2 and S4-3) fall outside of the desired design conditions. If the determined leadframe tips are judged to be outside of the ranges of the design conditions (YES) at step S5-2, the process returns to step S4-3, where the center of the circle which determines where to dispose the leadframe is moved to change the leadframe tip interval. If the determined leadframe tips are judged not outside of the ranges of the design conditions (NO), the process goes to step S7, where the determined leadframe tips are judged to determine whether they satisfy design criteria. If the determined leadframe tips satisfy the design criteria (YES) at step S7, design results are displayed at step S8. If the determined leadframe tips do not satisfy the design conditions (NO), the process returns to step S4-2 to reset the leadframe tip width.

The above conventional design method has a disadvantage in that a plurality of arrangement lines such as cavity lines need to be inputted as design conditions. Further, since the leadframe tip width and interval are determined according to the same criterion, pertaining to a circle diameter, for instance, it is difficult to provide optimum values independently for the leadframe tip width and interval.

As described above, in the conventional leadframe tip arrangement designing method, it is difficult to determine a cavity line where leadframe tips are located. As a result, designing takes a long time and design results vary to a large extent from one designer to another. Further, the conventional method has the disadvantage that the leadframe tip width and interval cannot be set independently because they are determined according to the same criterion. This is a significant limitation on this design method's potential and usefulness.

SUMMARY OF THE INVENTION

The present invention has been made to solve the above problems in the art and has as an exemplary object to provide a method for designing a straight arrangement of leadframe tips which enables highly flexible designing with better design results.

According to one exemplary aspect of the present invention, in a leadframe tip arrangement designing method, a leadframe tip arrangement region is first set opposed to a die pad sideline of a leadframe, and then a leadframe tip arrangement line is set in the leadframe arrangement region. Further, a predetermined number of leadframe tips are arranged on the leadframe tip arrangement line at proper intervals.

In another exemplary aspect of the present invention, in the leadframe tip arrangement designing method, the leadframe tip arrangement region is set based on a straight line perpendicular to the die pad sideline and extending from a center thereof, and a straight line extending from an end of the die pad sideline and forming a proper angle with the die pad sideline.

In another exemplary aspect of the present invention, in the leadframe tip arrangement designing method, the leadframe tip arrangement region is set based on a line connecting a first point that is located on a straight line perpendicular to the die pad sideline and extending from a center thereof and has a proper first distance from the die pad side line, and a second point that is located on a straight line extending from an end of the die pad sideline and forming a proper angle with the die pad sideline and has a proper second distance from the end of the die pad sideline.

In another exemplary aspect of the present invention, further in the leadframe tip arrangement designing method, plural values of the first distance are sequentially selected, and plural values of the second distance are sequentially selected. Thereby, a plurality of leadframe tip arrangement lines are set based on the plural values of the first distance and the plural values of the second distance. Then, an optimum leadframe tip arrangement line is determined from the plurality of leadframe tip arrangement lines.

In another exemplary aspect of the present invention, in the leadframe tip arrangement designing method, the leadframe tip arrangement line is a straight line.

In another exemplary aspect of the present invention, in the step of arranging the leadframe tips in the leadframe tip arrangement designing method, plural arrangements of the leadframe tips are determined by sequentially selecting plural values of a leadframe tip width and plural values of a leadframe interval, and an optimum arrangement of the leadframe tips is determined from the plural arrangements.

In another exemplary aspect of the present invention, in the leadframe tip arrangement designing method, the plural values of the leadframe tip width and the plural values of the leadframe tip interval are sequentially selected independently of each other.

Other features and advantages of the invention will be apparent from the following description taken in connection with the accompanying drawings.

DETAILED DESCRIPTION OF THE PREFERRED EMBODIMENTS

Figure 1:
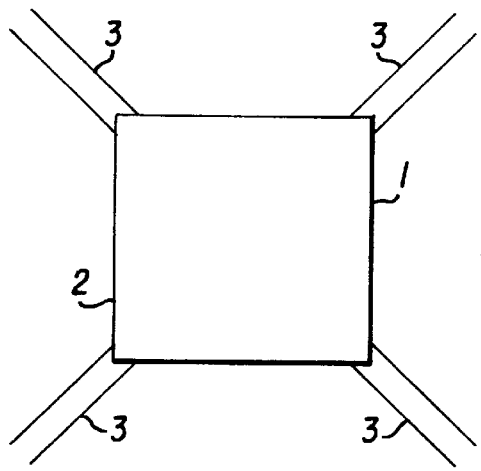
FIG. 1 is an exemplary plan view of a die pad of a leadframe to which the present invention is applied.

Embodiments of the present invention will be hereinafter described with reference to the accompanying drawings. In the drawings, the same reference numerals and characters denote the same or corresponding parts.

FIG. 1 is a conceptual plan view showing a die pad of a leadframe to which the invention is applied. Numerals 1–3 denote a die pad, a die pad sideline (i.e. a line defining a side of the die pad), and a suspension lead, respectively. The die pad 1 is supported by the suspension leads 3 at the four corners of the die pad.

Figure 2:
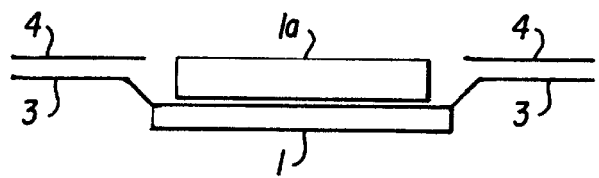
FIG. 2 is a sectional view of the die pad of FIG. 1.

FIG. 2 is a schematic sectional view of the die pad of FIG. 1. In FIG. 2, reference numerals 1a and 4 denote a semiconductor chip and a leadframe tip, respectively. As seen from FIG. 2, the die pad 1 is positioned lower than the leadframe tips 4. To be precise, the leadframe tips 4 are located above the suspension leads 3. FIG. 2 schematically shows a relationship in height between the die pad 1 and the leadframe tips 4.

Figure 3:
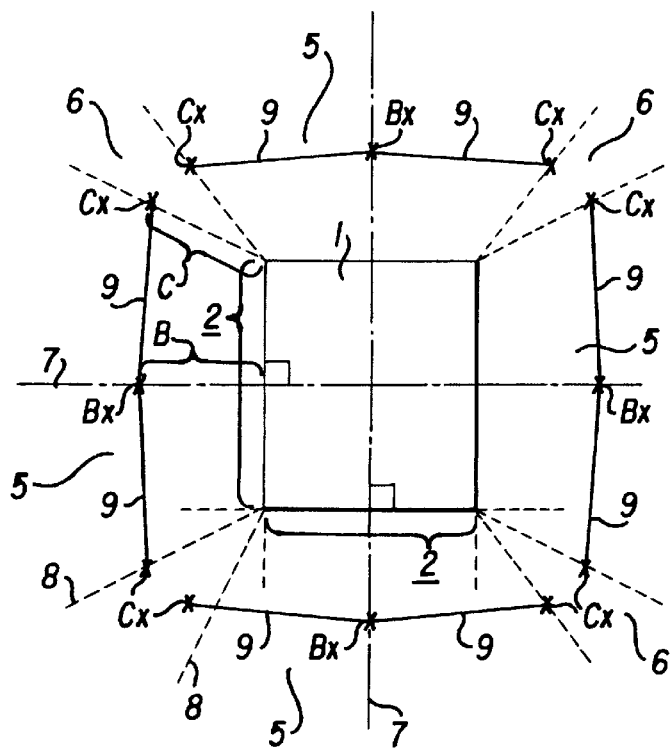
FIGS. 3 and 4 illustrate exemplary leadframe tip arrangement lines according to the present invention.

FIG. 3 shows arrangement lines of lead tips of the leadframe (hereinafter referred to as "leadframe tips") which are opposed to the die pad shown in FIGS. 1 and 2.

In FIG. 3, reference numeral 1 denotes the die pad. Reference number 2 denotes the die pad sideline (4 lines in total). Reference number 5 denotes a leadframe tip arrangement region. Reference number 6 denotes a suspension lead arrangement region. Reference number 7 denotes a line perpendicular to the corresponding die pad sideline 2 passing through its center. The perpendicular line 7 divides the leadframe tip arrangement region 4. Numeral 8 denotes peripheral lines extending from the ends of the die pad sidelines 2 and defining the leadframe tip arrangement regions 5. The peripheral lines 8 also define the suspension lead arrangement regions 6 in between the leadframe tip arrangement regions 5. Numeral 9 denotes a leadframe tip arrangement line which is a line segment connecting points Bx and Cx. Point Bx is located on the straight line 7 and has a distance B from the corresponding die pad sideline 2. Point Cx is located on the straight line 8 and has a distance C from the corresponding end of the die pad sideline 2.

Figure 4:
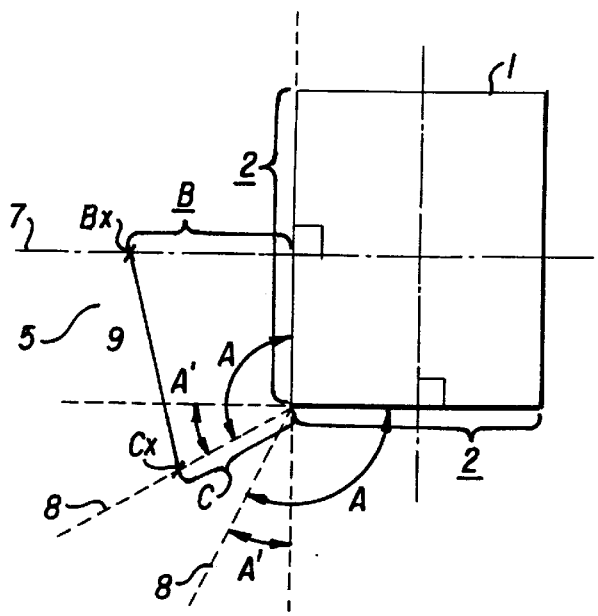

FIG. 4 is a plan view concentrating on the bottom-left part of FIG. 3 which is selected to illustrate a method for determining the leadframe tip arrangement lines 9 to determine the positions of the leadframe tips. In FIG. 4, reference character A represents an angle formed by the die pad sideline 2 and the straight line 8, and A' represents a portion of the angle A exceeding a right angle (90 degrees) (i.e. A'=A−90). The other reference numerals and characters in FIG. 4 denote the same parts as in FIG. 3 and hence will not be described here.

Figure 5:
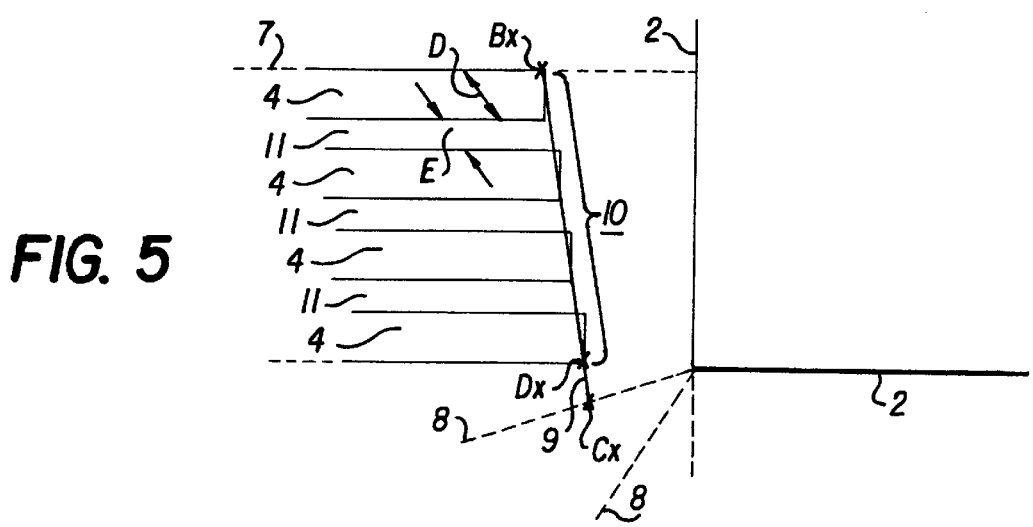
FIG. 5 illustrates an exemplary arrangement in which leadframe tips and their intervals are set on one of the leadframe tip arrangement lines according to the present invention.

FIG. 5 show an arrangement in which the leadframe tips and their intervals are set on the leadframe tip arrangement line 9 in the partial diagram of FIG. 4 according to a leadframe tip arrangement designing method of the present invention. In FIG. 5, reference numeral 10 denotes a leadframe tip arrangement portion (line segment Bx-Dx) on which the leadframe tips are arranged according to the designing method of the present invention. The portion 10 is part of the leadframe tip arrangement line 9 (line segment BX-CX). Numeral 4 denotes leadframe tips that have been arranged by the designing method of the present invention, and numeral 11 denotes intervals (gaps) between the leadframe tips 4, which intervals have also been arranged by the designing method of the present invention. Reference character D represents a leadframe tip width as measured along line segment Bx-Cx, and reference character E represents a leadframe tip interval as measured along line segment Bx-Cx.

Figure 6:
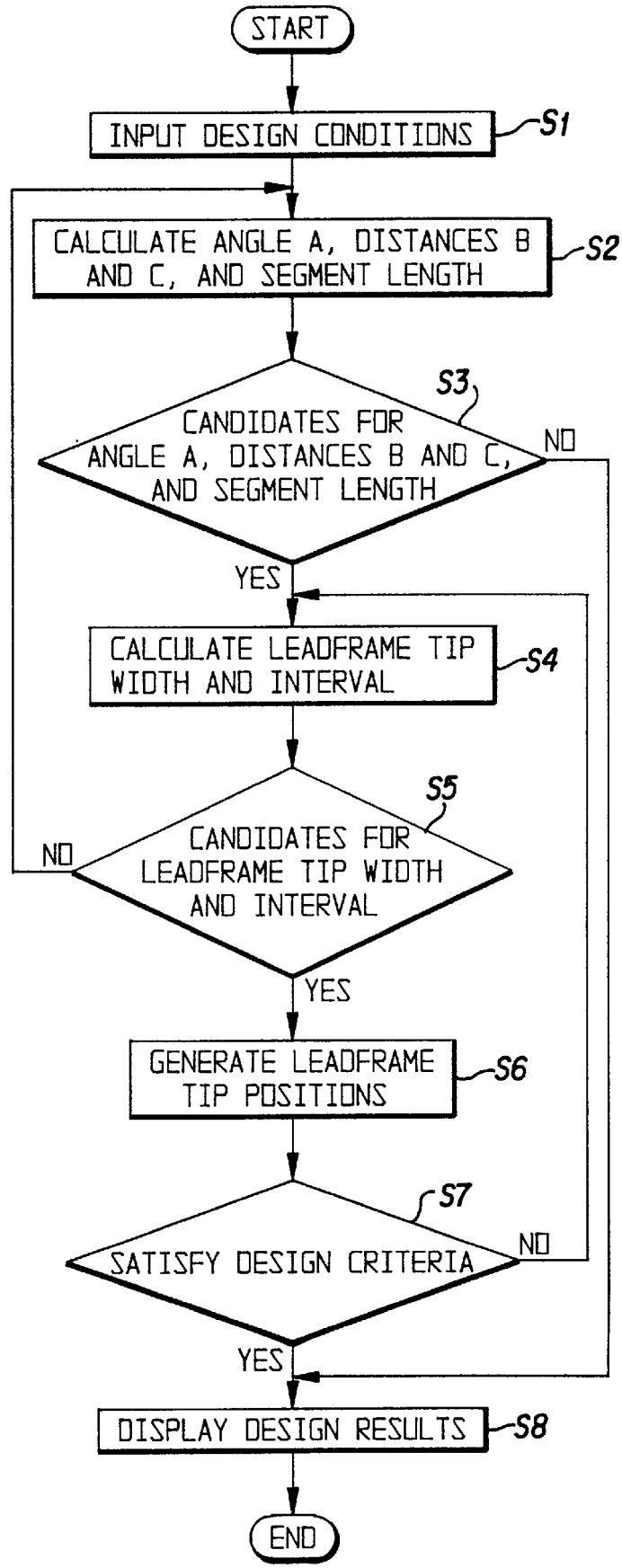
FIG. 6 is a flowchart showing exemplary steps of a leadframe tip arrangement designing method according to the present invention.
Figure 8:
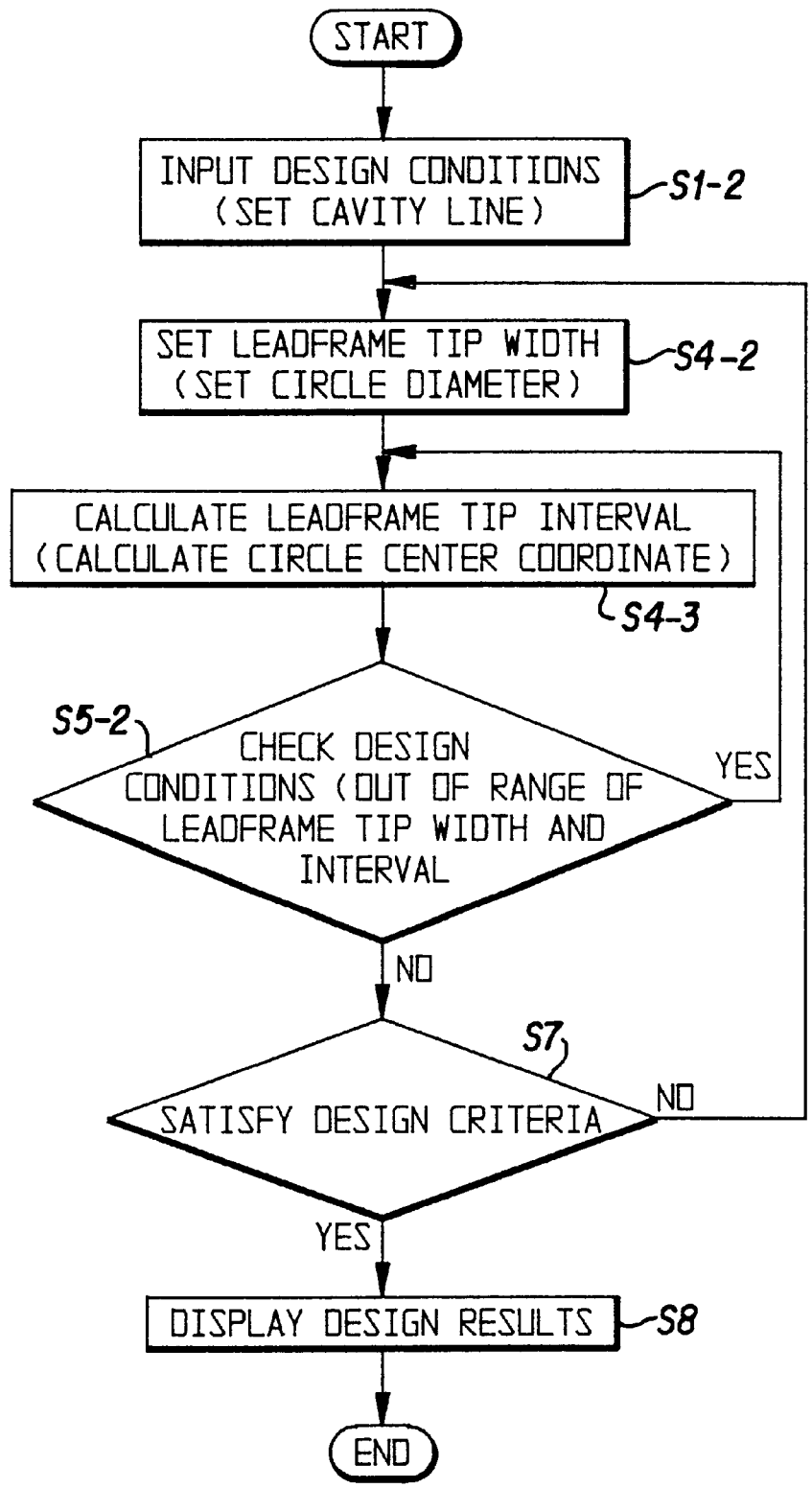
FIG. 8 is a flowchart showing a conventional leadframe tip arrangement designing method.

FIG. 6 is a flowchart showing exemplary steps of the leadframe tip arrangement designing method according to the present invention.

In FIG. 6, reference character S1 denotes a processing step for inputting design conditions pertaining to a leadframe which is the subject of design. Reference character S2 denotes a processing step for calculating the angle A and the distances B and C, and the length (hereinafter also referred to as "segment length") of the leadframe tip arrangement portion 10. Reference character S3 denotes a processing step for judging whether there exist candidates for the angle A, the distances B and C, and the segment length. Reference character S4 denotes a processing step for calculating the leadframe tip width and interval. Reference character S5 denotes a processing step for judging whether there exist candidates for the leadframe tip width and interval. Reference character S6 denotes a processing step for generating leadframe tip positions. Reference character S7 denotes a processing step for judging whether the leadframe tips generated in step S6 satisfy design criteria such as limitations relating to metallic mold working. Finally, step S8 denotes a processing step for showing design results. If there is no design solution, a message to that effect is outputted.

Next, with reference to FIG. 6, the method for designing a straight arrangement of leadframe tips according to the present invention will be described in further detail. In discussing FIG. 6, reference will also be made to FIGS. 4 and 5 which graphically show how the leadframe tips are arranged, according to one exemplary embodiment.

Referring to FIGS. 4 and 6, first, at step S1, the following parameters are inputted: the size of the die pad 1, the number of leads 4 to be arranged (i.e., the number of leadframe tips), the variable ranges of the angle A of the line segment 8 (or the angle A' which defines the suspension lead arrangement region 6) and the distances B and C between the die pad sideline 2 and respective ends Bx and Cx of the line segment 9.

At step S2, a value is selected from the variable range of each of the angle A and the distances B and C. The same value of one parameter may be selected to produce different combinations. The leadframe tip arrangement portion 10 (line segment Bx-Dx) is cut out from the leadframe tip arrangement line 9 (line segment Bx-Cx).

To automatically determine the values of A–C, a combination of values is obtained by sequentially adding increments to initial values so as to generate values that are within the specified variable ranges. Referring to FIG. 5, the length of the line segment 10 is determined so as to be no longer than the length of the line segment 9 and no shorter than (the minimum value of the leadframe tip width D)×(the necessary number of leads) plus (the minimum value of the leadframe tip interval E)×(the necessary number of intervals).

The line segment 10 is determined such that Bx and Dx are respectively used as the starting point and end point, respectively. The end point Dx is shifted towards point Cx when a predetermined increment is sequentially added to the minimum length. However, the length of the line segment 10 is prohibited from exceeding the length of the line segment 9, as mentioned above. That is, the end point Dx of the line segment 10 should not pass point Cx.

At step S3, it is judged whether candidates of each of the angle A, the distances B and C, and the segment length are within the variable range. If the judgment result is YES, the process goes to step S4.

When all the combinations (i.e. permutations) of values of the angle A, the distances B and C, and the segment length have been selected, the judgment result of step S3 becomes NO, and the process goes to step S8, where a message "No design solution" is displayed.

At step S4, the leadframe tip width D and the leadframe tip interval E are calculated (see FIG. 5). As in the case of step S2, candidates of the leadframe tip width D are generated by sequentially adding a predetermined increment within the range of the minimum tip width to the maximum tip width. Similarly, candidates of the leadframe tip interval E are generated by sequentially adding a predetermined increment within the range of the minimum tip interval to the maximum tip interval. In this manner, the values of the leadframe tip width D and the leadframe tip interval E can be selected independently.

If it is judged at step S5 that there exist candidates of the leadframe tip width D and the leadframe tip interval E, at step S6 leadframe tip shapes are drawn on the line segment 9 as shown in FIG. 5.

When all the combinations of values of the leadframe tip width D and the leadframe tip interval E have been selected, the judgment result of step S5 becomes NO, and the process returns to step S2, where a new combination of values of the angle A, the distances B and C, and the segment length is calculated.

At step S7, it is judged whether the lead tip shapes satisfy the design criteria. If the judgment result is YES, the process goes to step S8, where the determined leadframe tip shapes are shown, i.e., displayed to a designer. If the judgment result at step S7 is NO, the leadframe tip width D and the leadframe tip interval E are recalculated to generate another set of candidates. In this manner, according to the present invention, the leadframe tips 4 and the leadframe intervals 11 can be arranged freely.

In the above embodiment, values of the angle A, the distances B and C, the segment length, and the leadframe tip width and interval are automatically determined such that an increment is sequentially added to the initial value of each parameter to generate a value within the variable range to thereby generate a combination of parameter values. Similar advantages can be obtained by randomly selecting an arbitrary value within the variable range for each parameter.

In the above embodiment, the distances B and C are measured from the die pad sideline 2. Similar advantages can be obtained by measuring those distances from the sideline of a die pad of a reduced size.

The above exemplary embodiment is directed to the case where the suspension leads 3 are located at the four corners of the die pad 1. Where the suspension leads 3 are not located at the corners, the interval between the two adjacent straight lines 8 (see FIG. 4) can be narrowed. Where the suspension leads 3 extend from the die pad sidelines 2, the designing and arrangement can still be performed in a similar manner by dividing the line segment Bx-Cx and using line segments excluding the portion where the suspension lead 3 exists.

Although, in the above embodiment, the perpendicular line 7 extends from the center of the die pad sideline 2 to divide the leadframe tip arrangement region 5, it may extend from a point on the sideline 2 other than its center.

Figure 7:
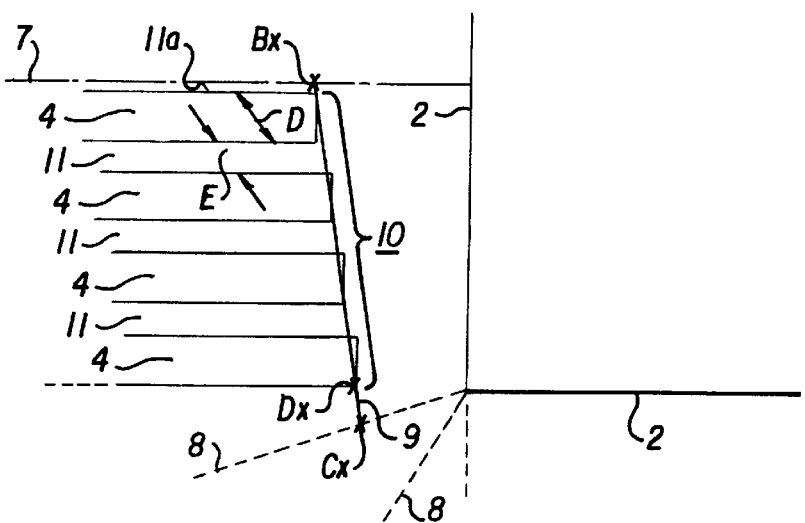
FIG. 7 shows another example in which leadframe tips and their intervals are set on one of the leadframe tip arrangement lines according to the present invention.

FIG. 7, which corresponds to the partial diagram of FIG. 4, shows another example in which leadframe tips and their intervals are set on the leadframe tip arrangement line according to the leadframe tip arrangement designing method of the present invention.

In FIG. 5, the first leadframe tip 4 is so disposed that its sideline coincides with the perpendicular 7 extending from the center of the die pad sideline 2. In contrast, in FIG. 7, a leadframe tip interval 11a having a given width is so disposed as to include the perpendicular 7 extending from the center of the die pad sideline 2. In one exemplary embodiment, the leadframe tip interval 11a occupying one side portion of the center line 7 is given a width that is half of the width of the other intervals 11. In this manner, the leadframe tip width and interval can be designed and arranged freely.

In the above embodiments, the die pad 1 is drawn to have a generally square shape. However, even if the die pad 1 is rectangular, the invention can still be applied to each of the die pad sidelines.

As described above, according to the above-described exemplary embodiments, the optimum leadframe tip arrangement can be automatically designed (e.g. with the use of an electronic computer) by specifying design conditions.

As has been described in detail above, according to the invention, not only can the time necessary for designing be reduced but also variations in design results among designers can be reduced by automatically determining optimum arrangement lines of leadframe tips and automatically arranging the leadframe tips along the arrangement lines thus determined.

Further, a region to dispose leadframe tips, arrangement lines of leadframe tips, and leadframe tip width and interval can be set or designed independently or integrally, which allows a high degree of freedom in designing.

Further, the leadframe tip width and interval can be determined independently, so that the designing can be performed in a more flexible manner to provide better design results.

Further, the optimum arrangement of leadframe tips and their intervals can be determined automatically such that the leadframe tips are arranged on straight lines and the leadframe tip width and interval are set constant respectively. As a result, a leadframe structure that secures proper formation of a metallic mold and a stable bonding operation can be obtained automatically.

Obviously many modifications and variations of the present invention are possible in the light of the above teachings. It is therefore to be understood that, within the scope of the appended claims, the invention may by practiced otherwise than as specifically described.

What is claimed is:

1. A leadframe tip arrangement designing method comprising the steps of:

setting a leadframe tip arrangement region opposed to a die pad sideline of a leadframe;

setting a leadframe tip arrangement line in said leadframe arrangement region; and after said step of setting a leadframe arrangement line, arranging a predetermined number of leadframe tips on said leadframe tip arrangement line at intervals.

2. The leadframe tip arrangement designing method according to claim 1, wherein said leadframe tip arrangement region is set based on a straight line perpendicular to said die pad sideline and extending from a center thereof, and a straight line extending from an end of said die pad sideline and forming an angle with said die pad sideline.

3. The leadframe tip arrangement designing method according to claim 1, wherein said leadframe tip arrangement region is set based on a line connecting a first point that is located on a straight line perpendicular to said die pad sideline and extending from a center thereof and has a first distance from said die pad side line, and a second point that is located on a straight line extending from an end of said die pad sideline and forming an angle with said die pad sideline and has a second distance from the end of said die pad sideline.

4. The leadframe tip arrangement designing method according to claim 3, further comprising:

sequentially selecting plural values of said first distance;

sequentially selecting plural values of said second distance;

setting a plurality of leadframe tip arrangement lines based on said plural values of said first distance and the plural values of said second distance; and determining an optimum leadframe tip arrangement line from said plurality of leadframe tip arrangement lines.

5. The leadframe tip arrangement designing method according to claim 1, wherein said leadframe tip arrangement line is a straight line.

6. The leadframe tip arrangement designing method according to claim 1, wherein said step of arranging the leadframe tips comprises the substeps of:

determining plural arrangements of the leadframe tips by sequentially selecting plural values of a leadframe tip width and plural values of a leadframe interval; and determining an optimum arrangement of said leadframe tips from said plural arrangements.

7. The leadframe tip arrangement designing method according to claim 6, wherein said plural values of the leadframe tip width and said plural values of the leadframe tip interval are sequentially selected independently of each other.

8. A leadframe tip arrangement designing method comprising the steps of:

inputting parameters which set a leadframe tip arrangement region opposed to a die pad sideline of a leadframe, wherein said leadframe tip arrangement region is defined by a line connecting a first point that is located on a straight line perpendicular to said die pad sideline and extending from a center thereof and has a first distance from said die pad side line, and a second point that is located on a straight line extending from an end of said die pad sideline and forming an angle with said die pad sideline and has a second distance from the end of said die pad sideline;

setting a leadframe tip arrangement line in said leadframe arrangement region;

wherein said step of setting a leadframe tip arrangement line comprises the substeps of:

sequentially selecting plural values of said first distance;

sequentially selecting plural values of said second distance;

setting a plurality of leadframe tip arrangement lines based on said plural values of said first distance and the plural values of said second distance; and determining an optimum leadframe tip arrangement line from said plurality of leadframe tip arrangement lines; and arranging a predetermined number of leadframe tips on said leadframe tip arrangement line at intervals;

wherein said step of arranging the leadframe tips comprises the substeps of:

determining plural arrangements of the leadframe tips by sequentially selecting plural values of a leadframe tip width and plural values of a leadframe interval; and determining an optimum arrangement of said leadframe tips from said plural arrangements.

* * * * *